(12) United States Patent
Jepsen et al.

(10) Patent No.: US 7,851,973 B1
(45) Date of Patent: Dec. 14, 2010

(54) USING PIEZO-ELECTRIC MATERIAL TO SIMULATE A VIBRATION ENVIRONMENT

(75) Inventors: Richard A. Jepsen, Albuquerque, NM (US); Neil T. Davie, Cedar Crest, NM (US); Douglas J. Vangoethem, Albuquerque, NM (US); Edward F. Romero, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 265 days.

(21) Appl. No.: 11/620,886

(22) Filed: Jan. 8, 2007

Related U.S. Application Data

(60) Provisional application No. 60/759,912, filed on Jan. 18, 2006.

(51) Int. Cl.
*H01L 41/04* (2006.01)
*H02N 2/12* (2006.01)
(52) U.S. Cl. .................................. 310/328; 310/311
(58) Field of Classification Search ............. 310/311, 310/328, 81
See application file for complete search history.

(56) References Cited

U.S. PATENT DOCUMENTS

| | | | | |
|---|---|---|---|---|
| 2,228,499 | A | * | 1/1941 | Allendorff .................. 73/667 |
| 3,699,807 | A | * | 10/1972 | Kerley et al. ................ 73/665 |
| 6,135,392 | A | * | 10/2000 | Wakugawa ................... 244/164 |
| 2004/0140737 | A1 | * | 7/2004 | Barillot et al. ............... 310/328 |
| 2005/0109135 | A1 | * | 5/2005 | Defendini et al. ............. 74/5 R |

OTHER PUBLICATIONS

Jepsen et al., "Testing in a Combined Vibration and Acceleration Environment", Abstract only, Nov. 3, 2004.*

J.D. Rodgers et al, "Vibrafuge: Combined Vibration and Centrifuge Testing," *Shock and Vibration Symposium*, Virginia Beach, VA, Nov. 1989.

R. A. Jepsen and E.F. Romero, "Testing in a Combined Vibration and Acceleration Environment," IMAC XXIII, Orlando, FL, Jan. 2005.

* cited by examiner

*Primary Examiner*—Derek J Rosenau
(74) *Attorney, Agent, or Firm*—Madelynne J. Farber; Scott B. Stahl

(57) ABSTRACT

A target object can be vibrated using actuation that exploits the piezo-electric ("PE") property. Under combined conditions of vibration and centrifugal acceleration, a centrifugal load of the target object on PE vibration actuators can be reduced by using a counterweight that offsets the centrifugal loading. Target objects are also subjected to combinations of: spin, vibration, and acceleration; spin and vibration; and spin and acceleration.

23 Claims, 4 Drawing Sheets

USING PIEZO-ELECTRIC MATERIAL TO SIMULATE A VIBRATION ENVIRONMENT

This application claims the priority under 35 U.S.C. §119 (e)(1) of provisional application Ser. No. 60/759,912, filed Jan. 18, 2006 and incorporated herein by reference.

This invention was developed under Contract DE-AC04-94AL85000 between Sandia Corporation and the U.S. Department of Energy. The U.S. Government has certain rights in this invention.

FIELD OF THE INVENTION

The invention relates generally to the simulation of mechanical operating conditions and, more particularly, to the simulation of vibration conditions.

BACKGROUND OF THE INVENTION

The need for simulation of vibration conditions that will be experienced by a given entity is well known in the art. Such vibration simulation is useful in the design, development, and qualification of myriad products employed in consumer, commercial, industrial, aerospace, and military applications. Shakers can sometimes be used to simulate vibration conditions in combination with centrifuges that simulate acceleration conditions.

Such mechanical shakers simulate vibration conditions by employing mechanical drive arrangements to drive mechanically movable components. It is therefore apparent that, by their very nature, mechanical shakers have complicated designs, tend to be physically large, heavy and cumbersome, and have considerable potential to exhibit reliability problems. These problems can be particularly acute when the shakers are subjected to other environments such as centrifuge acceleration.

It is therefore desirable to provide for improvements in the simulation of vibration environments.

DETAILED DESCRIPTION

Exemplary embodiments of the invention simulate vibration conditions by exploiting materials that possess the piezoelectric (also referred to herein as "PE") property. If a positive voltage is applied across a material having the PE property, the length of the material increases. Reversing the polarity of the applied voltage causes the length of the material to decrease. Exemplary embodiments of the invention use these characteristics to produce a vibration condition.

Figure 1:
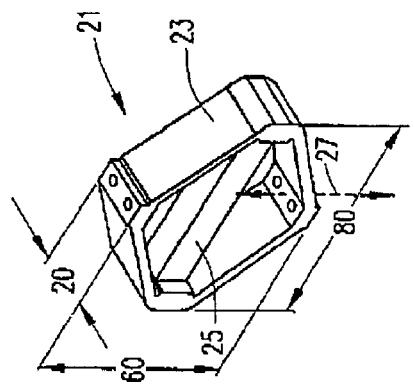
FIGS. 1 and 2 are perspective views of commercially available piezo-electric actuators.
Figure 2:
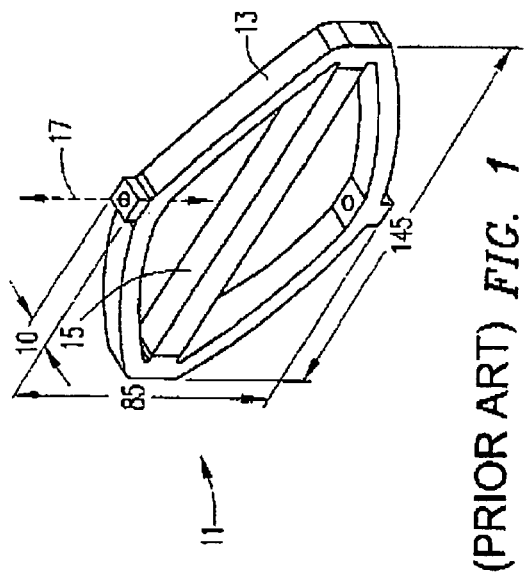

FIGS. 1 and 2 are perspective views of commercially available piezo-electric actuators, with dimensions shown in mm. The actuators 11 and 21 include respective steel frames 13 and 23 that hold respective stacks 15 and 25 of PE ceramic cells. The PE stacks 15 and 25 will extend in length in response to the application of a positive voltage. This causes the both sides of the steel frames 13 and 23 to be displaced vertically toward the respective PE stacks 15 and 25, so the actuators 11 and 21 contract vertically. The PE stacks 15 and 25 will contract in length in response to a reversal in the polarity of the applied voltage. This causes both sides of the steel frames 13 and 23 to be displaced vertically away from the respective PE stacks 15 and 25, so the actuators 11 and 21 expand vertically. The reciprocal displacements described above are also referred to herein as frame displacement strokes. Frame displacement strokes occur along a displacement axis, such as shown generally at 17 and 27 in FIGS. 1 and 2. The PE actuators 11 and 21 are essentially "solid state" devices, with no internal moving parts.

Piezo-electric ceramic materials are inherently dense, so even compactly sized PE actuators such as 11 and 21 can deliver a relatively strong actuation force. Piezo-electric actuators are commercially available in a wide variety of actuation force (load) and displacement stroke ranges. As set forth below, PE actuators such as 11 and 21 are conventionally used to perform various functions in a variety of applications:

Optics & Vision Applications—Positioning of mirrors or lenses, Micro-scanning, Dithering, Focusing, Laser cavity tuning, Alignment or deformation of fibers, Deformation of FBG, Scanners, Choppers, Interferometers, Modulators, PDP glass cutting;

Mechanics Applications—Positioning of tools, Pick & Place, Clamps, Active Wedges, Damping, Active control, Generation of ultrasonic or sonic vibrations, Health monitoring;

Fluids Applications—Proportional valves, Pumps, Measuring, Injections, Ink jet, Droplet generators, Flow mass meter;

Electronics Applications—Positioning of masks, wafers or magnetic heads, Non-magnetic actuation, Circuit breakers, Chip testing;

Air & Space Applications—Active flaps, Shape control, Active wing; and

Electrical Energy Applications—Piezoelectric generator, Energy harvesting, Electric switch.

According to exemplary embodiments of the invention, the operation of PE actuators, such as described above with respect FIGS. 1 and 2, is used to simulate vibration conditions. Repeated voltage polarity reversals will produce correspondingly repeated reciprocal displacements of the actuator frame (e.g., 13 or 23 in FIG. 2). If the PE actuator is suitably mounted to a target object, then the target object will experience vibration corresponding to the reciprocal displacements of the actuator frame.

Figure 3:
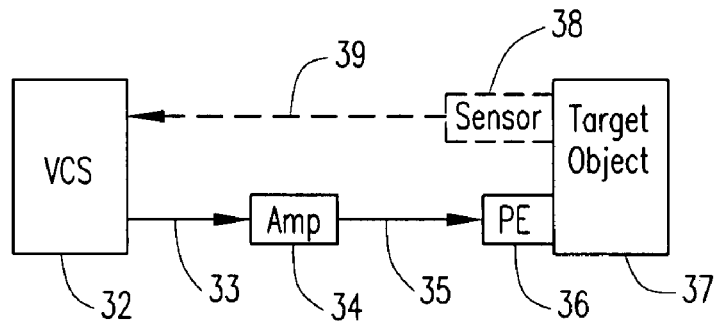
FIG. 3 diagrammatically illustrates a vibration simulation system according to exemplary embodiments of the invention.

FIG. 3 diagrammatically illustrates exemplary embodiments of a vibration simulation system according to the invention. In the system 31 of FIG. 3, a vibration control system (VCS) 32 provides one or more voltage signals at 33. An amplifier arrangement 34 receives the one or more voltage signals at 33 and produces therefrom one or more respectively corresponding and suitably amplified drive voltage signals 35. The drive voltage signaling at 35 drives a PE actuator arrangement 36 mounted to a target object (also referred to interchangeably herein as a "test unit") 37. In response to the drive voltage signaling at 35, the frames of the PE actuators at 36 exhibit reciprocal displacement as described above with respect to FIGS. 1 and 2, thereby imparting vibration to the target object 37. The voltage signaling 33 and corresponding drive voltage signaling 35 are produced, respectively by the VCS 32 and the amplifier arrangement 34, such that the target object 37 will experience a vibration condition in accordance with a desired vibration profile. In some embodiments, the PE actuator arrangement 36 consists of a single PE actuator driven by a single drive voltage signal at 35. In various embodiments, each voltage signal 33 from the VCS 32 may provide input to one or more amplifiers at 34, and each amplifier may in turn drive one or more PE actuators at 36.

Piezo-electric actuators, such as shown in FIGS. 1 and 2, are significantly smaller than the conventional mechanical shakers mentioned above. This provides for great flexibility in the design of the PE actuator arrangement 36. For example, the PE actuator arrangement 36 provides scalability, because the number of constituent PE actuators therein can be easily increased as the size of the target object 37 increases. Also, each of the constituent PE actuators of the arrangement 36 can be mounted relatively easily in any desired physical orientation, so that the displacement axis of any PE actuator can be oriented as desired. In various embodiments, groups of two or more PE actuators are mounted together in adjoining relationship in a chain-like configuration with their respective displacement axes aligned. This chain-like configuration produces a composite actuator whose frame displacement stroke is some desired multiple of the nominal frame displacement stroke of a single PE actuator. Thus, various embodiments employ any desired number of actuators and/or composite actuators, each having any desired frame displacement stroke, and each having its displacement axis oriented as desired.

In some embodiments, shown by broken line in FIG. 3, a sensor arrangement 38 including one or more sensors is mounted to the target object 37 to provide one or more feedback signals 39 to the VCS 32. These feedback signals 39 are indicative of the vibration condition(s) at one or more locations on the target object 37. The VCS 32 adjusts the voltage signaling at 33 based on the feedback signals 39 and the desired vibration profile. In some embodiments, the sensors are accelerometers.

Figure 4:
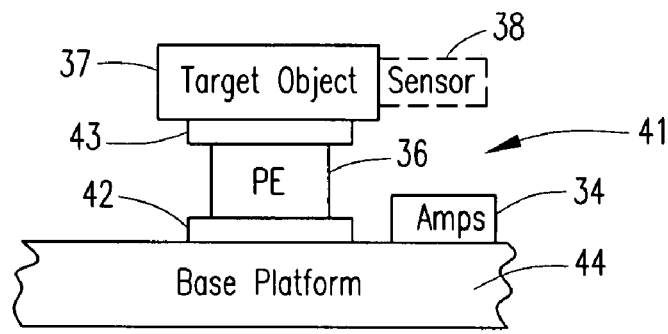
FIG. 4 diagrammatically illustrates a payload assembly according to exemplary embodiments of the invention.

FIG. 4 diagrammatically illustrates exemplary embodiments of a payload assembly 41 according to the invention. The payload assembly 41 includes the PE actuator arrangement 36, assembled on a mounting structure 43 that mounts the PE actuator arrangement 36 to the target object 37. The payload assembly 41 includes another mounting structure 42 that is connected to the PE actuator arrangement 36 opposite the mounting structure 43. The mounting structure 42 mounts to a base platform 44. The base platform 44 provides a reaction mass that permits the PE actuator arrangement 36 to impart vibration to the target object 37. The amplifier arrangement 34 is mounted on the base platform 44 in some embodiments. In feedback control embodiments, such as shown by broken line in FIG. 3, the payload assembly 41 also includes the sensor arrangement 38, mounted to the target object 37. In some embodiments, the sensor arrangement 38 is mounted to the PE actuator mounting structure 43. In some embodiments, part of the sensor arrangement 38 is mounted on the target object 37, and part is mounted on the PE actuator mounting structure 43.

Figure 5:
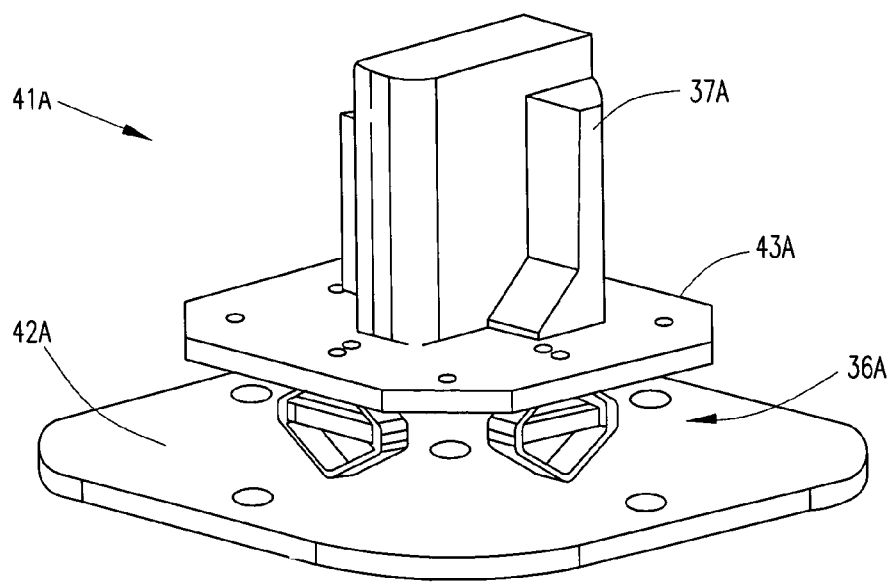
FIG. 5 illustrates the payload assembly of FIG. 4 in more detail according to exemplary embodiments of the invention.

FIG. 5 illustrates the payload assembly of FIG. 4 in more detail according to exemplary embodiments of the invention. In the payload assembly 41A of FIG. 5, the mounting structures 42A and 43A are rigid plates. In some embodiments, the plates 42A and 43A have provided therein respective patterns of holes arranged to provide a plurality of possible PE actuator mounting sites, thereby providing flexibility in the positioning of the PE actuator arrangement 36A relative to the test unit 37A. The PE actuators can be interposed between and bolted (or fastened in any other conventional manner) to the mounting plates 42A and 43A at any position where a hole in mounting plate 42A is aligned with a hole in mounting plate 43A. In some embodiments, each feedback sensor (not explicitly shown in FIG. 5) is mounted in proximity to a respectively corresponding PE actuator or a respectively corresponding grouping of PE actuators. In some embodiments, accelerometer sensors are readily mounted where desired using, for example, conventional adhesion techniques.

Figure 6:
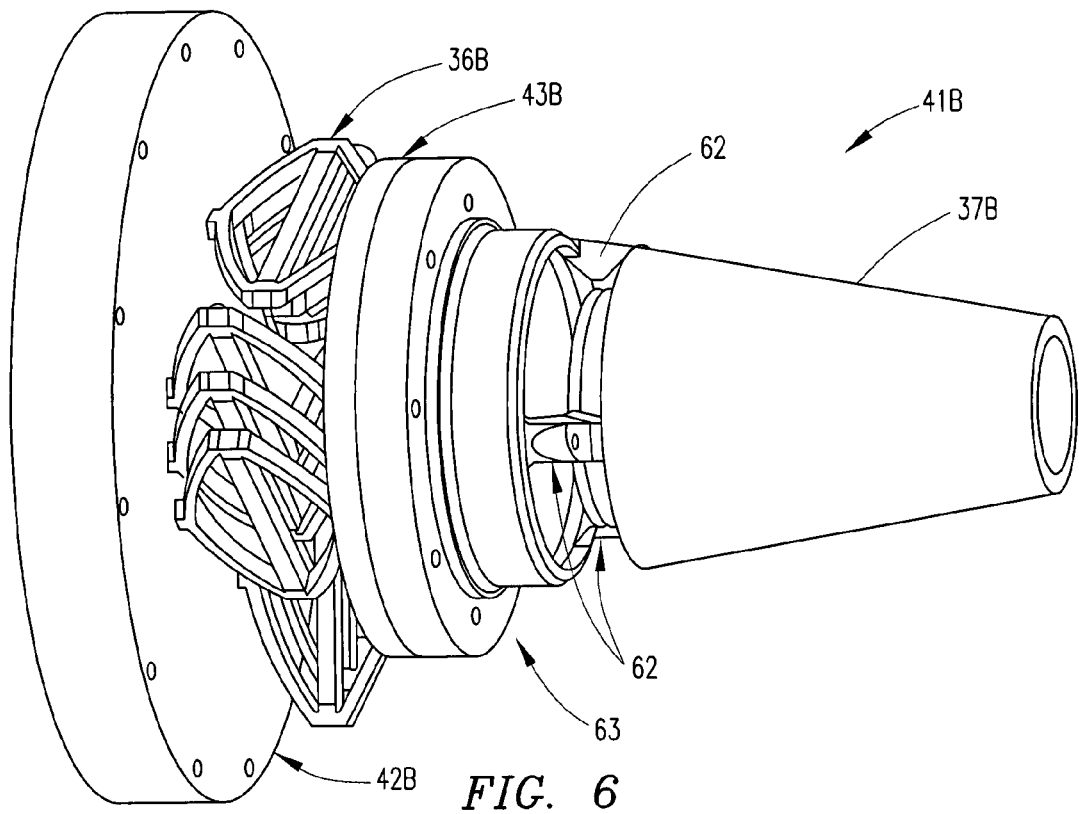
FIG. 6 illustrates the payload assembly of FIG. 4 in more detail according to further exemplary embodiments of the invention.

FIG. 6 illustrates the payload assembly of FIG. 4 in more detail according to further exemplary embodiments of the invention. In the payload assembly 41B of FIG. 6, the test unit 37B is connected to a mounting ring that includes a plurality of flexible legs 62. These flexible legs extend from the test unit 37B and terminate in a mounting flange 63 to which the PE actuator mounting structure 43B is fastened. In the payload assembly 41B, both of the mounting structures 42B and 43B are provided in the form of mounting plates. In the same fashion described above with respect to FIG. 5, the mounting plates 42B and 43B of FIG. 6 can be provided with respective hole patterns arranged to provide a plurality of possible PE actuator mounting sites, thereby providing flexibility in positioning the PE actuator arrangement relative to the test unit 37B. In some embodiments, the mounting plate 42B has an annular structure with a central opening (not explicitly shown in FIG. 6). In various embodiments, feedback sensors such as accelerometers are mounted on some or all of the flexible legs 62.

In the examples shown in FIGS. 5 and 6, the PE actuators are positioned peripherally around the respective test units in a generally symmetrical arrangement. In some embodiments, the PE actuators are positioned as necessary to produce vibration conditions in accordance with predetermined vibration profiles.

Referring again to FIG. 4, in some embodiments, the base platform 44 is a movable platform, which permits the target object (test unit) to be subjected to both vibration and acceleration conditions simultaneously. This is useful, for example, in the simulation of aircraft flight conditions, including launch conditions and atmospheric re-entry conditions experienced by a spacecraft. The payload assembly embodiments 41A of FIG. 5 are useful, for example, in the simulation of spacecraft launch conditions, and the payload assembly embodiments 41B of FIG. 6 are useful, for example, in the simulation of spacecraft re-entry conditions.

Figure 7:
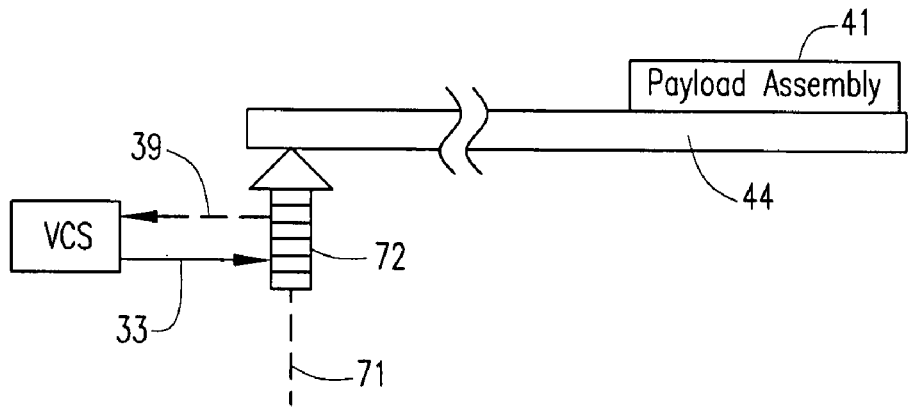
FIG. 7 diagrammatically illustrates a combined vibration and acceleration simulation system according to exemplary embodiments of the invention.

FIG. 7 diagrammatically illustrates exemplary embodiments of a system for simulating both vibration and acceleration conditions simultaneously according to the invention. In FIG. 7, the payload assembly 41 is mounted on a movable base platform that is designated as 44A, and is embodied as a centrifuge arm supported for rotation about an axis 71. Signals are routed between the VCS 32 and the payload assembly 41 in conventional fashion via a slip ring 72 disposed in alignment with the axis 71.

Figure 8:
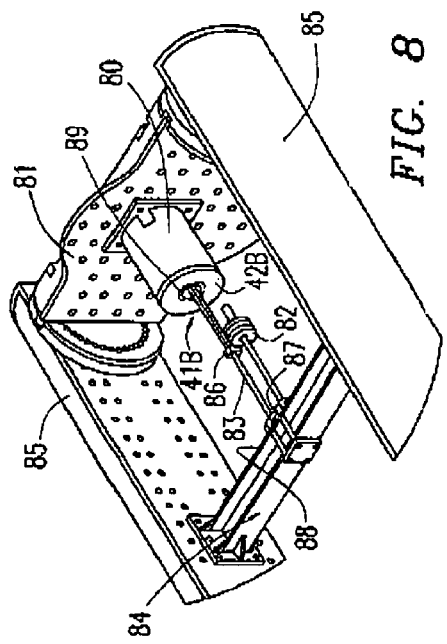
FIG. 8 diagrammatically illustrates the system of FIG. 7 in more detail according to exemplary embodiments of the invention.

FIG. 8 illustrates the system of FIG. 7 in more detail according to exemplary embodiments of the invention. In particular, FIG. 8 shows the payload assembly 41B of FIG. 6 mounted on the base platform 44A, embodied as a centrifuge arm assembly. FIG. 8 also illustrates additional features of the centrifuge arm assembly. In FIG. 8, the centrifuge arm assembly 44A includes a cylinder 80 mounted on a mounting plate 81 that is carried at the radially outer end of the centrifuge arm assembly 44A by two parallel centrifuge arm portions 85. The payload assembly 41B is received in the cylinder 80, with the mounting plate 42B bolted (or otherwise fastened) onto a radially inwardly facing surface on the radially inner end of the cylinder 80.

In some circumstances, the combination of the weight of the test unit and the acceleration that the centrifuge imparts to the test unit can produce an actuator overload condition wherein the load limit of the PE actuators is exceeded. For example, at 100 g's of steady acceleration, even a 7 lb. test unit can produce the actuator overload condition. The heavier the test unit, the lower the acceleration required to produce the actuator overload condition.

Exemplary embodiments of the invention can avoid the aforementioned actuator overload condition by employing an accelerated counterweight that compensates for the centrifugal load of the test unit. As shown in FIG. 8, some embodiments provide a counterweight 82 that is attached to one end of a strap 83 whose other end is attached to the payload assembly 41B. The strap 83 extends radially inwardly from the payload assembly 41B to a reaction beam 84 that is mounted on and extends between the parallel centrifuge arm portions 85. The strap 83 is looped over a sheave or pulley 87 that is mounted on a radially outwardly facing surface 88 of the reaction beam 84, such that a center axis of the sheave 87 is oriented generally parallel to the reaction beam 84. The strap 83 loops over the sheave 87 and passes downwardly through a space between the surface 88 and the sheave 87. When the centrifuge arm 44A is at rest (this condition is not explicitly shown in FIG. 8), the counterweight 82 hangs on the strap 83 straight downwardly below the aforementioned space between the surface 88 and the sheave 87. When the centrifuge arm assembly is in motion, centrifugal force causes the counterweight 82 to swing radially outwardly. At high enough g levels, the counterweight 82 will ultimately assume the fully radially extended position illustrated in FIG. 8. In some embodiments, the mass of the counterweight 82 is set such that the centrifugal force on the strap 83 directly cancels the centrifugal load of the test unit 37B on the PE actuators. In this way, the counterbalancing force varies automatically with the g level of the centrifuge.

The weight of counterweight 82 is determined in some embodiments by multiplying the weight of the test unit 37B by the ratio of the radial distances of the test unit and the counterweight from the rotational axis of the centrifuge. For example, if the counterweight 82, in its fully radially extended positioned as shown in FIG. 8, is located 24 feet from the rotational axis, and if the test unit 37B is located 28 feet from the rotational axis, and if the test unit 37B has a weight of 10 lbs., then the counterweight 82 should have a weight of 10×28/24=11.7 lbs.

In some embodiments, the strap 83 is a nylon cable or rope having formed at each end thereof loops that engage respective eyebolts (not explicitly shown) mounted on the counterweight 82 and on the mounting plate 43B of the payload assembly 41B (see also FIG. 6). To reach the mounting plate 43B, the strap 83 passes through the central opening 89 in the annular mounting plate 42B, and also passes through the PE actuator arrangement 36 mounted circumferentially around the opening 89 (see also FIG. 6). In some embodiments, the counterweight 82 is implemented by a base plate on which any desired combination of weights can be stacked in generally the same manner as exercise weights are placed on a barbell. In some embodiments, the strap 83 is rigged with a load sensor 86 positioned between the counterweight 82 and the payload assembly 41B, in the load path of the strap 83, as shown in FIG. 8. The load sensor 86 can be used to verify that the load canceling technique is working properly and the PE actuators are not being overloaded.

Figure 9:
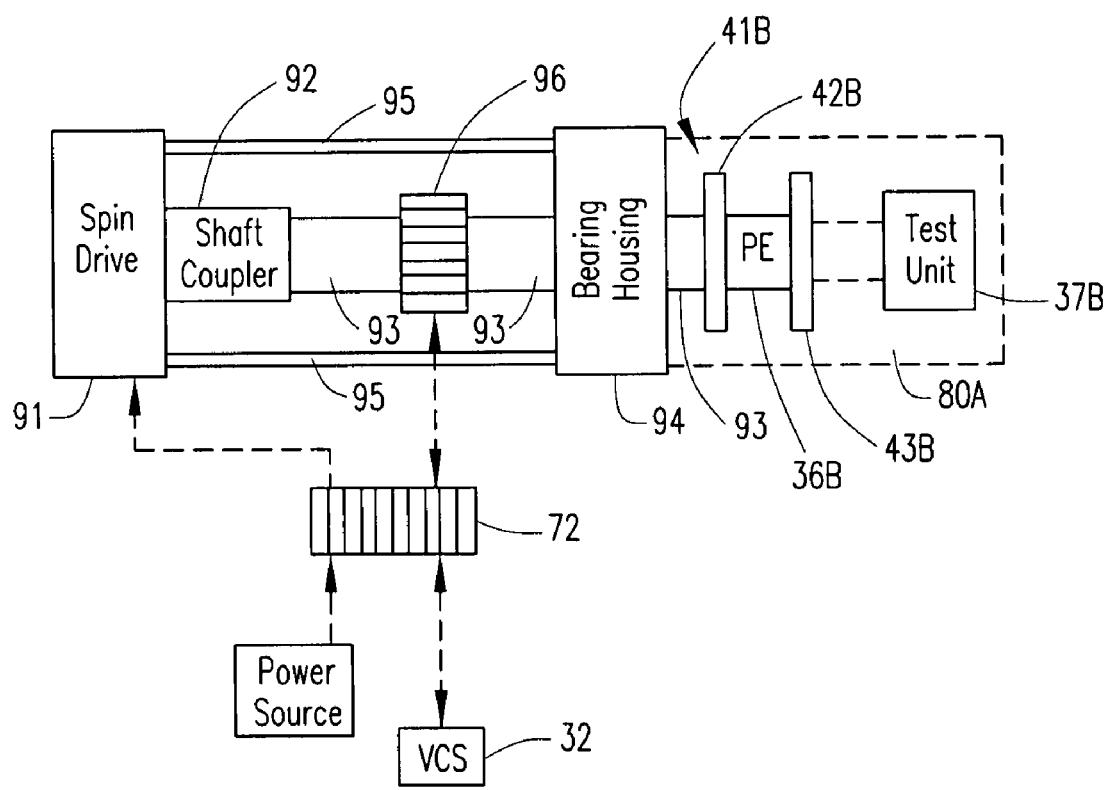
FIG. 9 diagrammatically illustrates a system that simulates a spin condition in combination with acceleration and/or vibration according to exemplary embodiments of the invention.

Referring again to FIG. 4, some embodiments of the invention are configured to spin (rotate) the payload assembly 41 relative to the base platform 44 in order to subject the target object 37 to spin testing. FIG. 9 diagrammatically illustrates examples of such embodiments in more detail. A spin drive 91 (e.g., a suitable rotary drive motor) is rotationally coupled to one end of a drive shaft 93 by a shaft coupler 92. The drive shaft 93 is supported for rotation by a bearing housing 94 that includes radial bearings to fix the drive shaft 93 radially, and thrust bearings to fix the drive shaft 93 axially. The end of the drive shaft 93 opposite the shaft coupler 92 is fixedly mounted (e.g., bolted) to the mounting plate 42B of the payload assembly 41B. In some embodiments, the spin drive 91 is mounted on the bearing housing 94 by mounting legs 95.

In the arrangement of FIG. 9, the exterior of the bearing housing 94 is configured as a plate or lid, for mounting on a cylinder 80A in generally the same fashion that the mounting plate 42B is mounted on the cylinder 80 of FIG. 8. The entire payload assembly 41B is thus received within the cylinder 80A, as shown in FIG. 9.

In some embodiments, signals are routed between the VCS 32 and the PE actuator arrangement 36B in conventional fashion via a slip ring 96 positioned on the drive shaft 93. In some embodiments, the target object is subjected to vibration, acceleration, and spin simultaneously, so both the slip ring 96 and the slip ring 72 (see also FIG. 7) are utilized to route signals between the VCS 32 and the payload assembly 41B. In some embodiments, the target object is subjected to spin and acceleration simultaneously, but without vibration, so the PE actuator arrangement 36B can be omitted. In some embodiments, the target object is subjected to vibration and spin simultaneously, but without acceleration, so the cylinder 80A does not move relative to the VCS 32 (as does the cylinder 80 of FIG. 8), and the slip ring 72 is therefore not required. In embodiments wherein the target object is subjected to both spin and acceleration simultaneously, operating power is routed to the spin drive via the slip ring 72 (as shown in FIG. 9). In embodiments where the aforementioned centrifugal load counterbalancing is used, the spin drive 91 can be suitably fitted with an exteriorly accessible eyebolt (not shown) to engage the counterweight strap 83 of FIG. 8.

In some embodiments, the drive shaft 93 weighs at least about 10 times the weight of the test unit 37B. In this way, the drive shaft 93 provides a low noise reaction mass that reduces undesired vibrational noise that can be produced by operation of the bearings in the bearing housing 94.

Referring again to FIGS. 1-3, the steel frames 13 and 23 preload the PE stacks 15 and 25. However, PE actuators of the type shown in FIGS. 1 and 2 often have an operating voltage range that is not symmetric about zero volts. In such cases, the amplifiers used at 34 (see also FIG. 3) can be chosen to include a conventional DC offset feature. With this DC offset feature, the output of the amplifier can be adjusted to have a DC offset that "centers" the PE actuators, thereby permitting the VCS 32 to control the PE actuators, via the amplifiers, using a VCS operating voltage range that is symmetric about zero volts. For example, for a conventional PE actuator having an operating voltage range from −20V to +150V, the amplifiers can be adjusted to a DC offset of 65V. With this DC offset, and assuming an amplification factor of 20 for the amplifiers (as is common in the art), a voltage range of −4V to +4V at 33 will produce a corresponding range of −15V to +145V at 35. If the amplifiers can provide up to 2.4 A of drive current (as is common in the art), the capacitive load of a PE actuator can be quickly driven for full stroke displacement about the mean position of the actuator. In some embodiments, the displacement of the PE actuators covers about 47.5 microns in each direction, for a full stroke of about 95 microns.

Still referring to FIG. 3, in some embodiments, the VCS 32 has a plurality of inputs available for sensor feedback signals 39 from several types of conventional sensors, including, for example, accelerometers that include integrated electronics. The VCS 32 digitizes feedback signals received from sensors, performs spectral content calculations in real time, and updates the voltage signals 33 as necessary to achieve a the overall vibration condition (profile) that is desired. In some embodiments, the VCS 32 has a plurality of outputs available to provide a plurality of voltage signals 33 that can each range from −10V to +10V.

In various embodiments of the invention, the VCS 32 includes modular control software with a variety of functionalities. For example, individual software modules can be used to control swept sine, random, shock, and mixed-mode testing, and software modules for signal analysis and transient capture can be provided. In any of the above-described embodiments that implement vibration-only testing, combined vibration and acceleration testing, combined vibration and spin testing, and combined vibration, acceleration, and spin testing, the VCS 32 can implement any of the following types of vibration test control: discrete open loop control; single input, single output (SISO) closed loop control; or multiple input, multiple output (MIMO) closed loop control.

In some discrete open loop control embodiments, the VCS 32 uses a single voltage signal at 33 to drive one or more PE actuators at 36 in parallel, via respectively corresponding amplifiers at 34. In various discrete open loop embodiments, sinusoidal voltage signals with frequencies that range from about 1 Hz to about 3000 Hz are used. Various discrete open loop control embodiments use either of the test items 37A and 37B.

In some SISO closed loop control embodiments, the VCS 32 operates in the random or swept sine mode, and uses a single voltage signal at 33 to drive a plurality of PE actuators at 36 in parallel, via respectively corresponding amplifiers at 34. A single sensor (e.g., accelerometer) is used at 38 to provide feedback information indicative of measured vibration. In some embodiments, the single sensor is positioned generally centrally with respect to the PE actuators. Various SISO closed loop embodiments use either of the test items 37A and 37B.

In MIMO closed loop control embodiments, the VCS 32 employs spectral density matrices to control: the power spectral density (PSD) magnitude associated with each of a plurality of drive control channels (where a drive control channel refers to an amplifier/PE actuator combination); the phase relationship between any two control channels; and coherence between any two control channels. These VCS capabilities are generally known in conventional vibration simulation systems that vibrate test items by mechanical shakers with multiple drives. However, the drive control channels in conventional systems use mechanical shakers instead of PE actuators. In such conventional operation: each of the drive control channels has associated therewith a respectively corresponding one of a plurality of accelerometer feedback channels; each drive voltage signal from the VCS has an affect on every drive control channel; and an undesired resonant response associated with a given drive control channel can be reduced by increasing the magnitude of an out-of-phase drive voltage on another drive control channel at the resonant frequency.

In some MIMO closed loop control embodiments of the invention, each of a plurality of pairs of drive control channels is driven in parallel by a respectively corresponding one of a plurality of voltage signals produced at 33 by the VCS 32, and each pair of drive control channels has associated therewith a respectively corresponding one of a plurality of sensor feedback channels. Various ones of these MIMO closed loop control embodiments use three pairs of drive control channels, three voltage signals 33, three sensor feedback channels 39, and either of the test items 37A and 37B.

In some MIMO closed loop control embodiments, each of a plurality of drive control channels is driven by a respectively corresponding one of a plurality of voltage signals produced at 33 by the VCS 32, and each of the drive control channels has associated therewith a respectively corresponding one of a plurality of sensor feedback channels. Various ones of these MIMO closed loop control embodiments use six drive control channels, six voltage signals 33, six sensor feedback channels 39, and either of the test items 37A and 37B.

MIMO closed loop control is useful, for example, in situations where natural frequency modes of the payload assembly tend to cause discrepancies between the desired vibration profile and the vibration condition that would be produced by the PE actuator arrangement without MIMO closed loop control. As one example, without MIMO closed loop control, the flexible legs 62 of the payload assembly 41B (FIG. 6) can contribute to undesired frequency modes. MIMO closed loop control can also be useful, for example, in compensating for unbalanced rotation of the drive shaft 93 in FIG. 9. Such unbalanced rotation can result in undesired rotational noise. However, the noise typically occurs at constant frequencies, so MIMO closed loop control can be effective in eliminating the noise.

In any or all of the above-described embodiments, the VCS 32 can be implemented, for example, by a conventional Spectral Dynamics Jaguar vibration control system.

Although exemplary embodiments of the invention have been described above in detail, this does not limit the scope of the invention, which can be practiced in a variety of embodiments.

What is claimed is:

1. An apparatus for subjecting a target object to vibration and spin, comprising:
    a target object supported for rotation about a central rotational axis thereof;
    an actuator assembly connected to the target object for rotation therewith about said axis and adapted to impart vibration to the target object, said actuator assembly including an actuator having a piezo-electric (PE) material and a frame connected to said PE material;
    a drive control input for receiving a drive control signal, said PE material coupled to said drive control input and cooperable with said frame for effecting, in response to said drive control signal, displacements of said frame relative to said PE material, said displacements producing said vibration; and
    a spin drive rotationally coupled to said target object for spinning said target object and said actuator assembly about said axis while said actuator assembly vibrates said target object.

2. The apparatus of claim 1, including a platform supported for movement, wherein said spin drive is carried on said platform, wherein said target object is supported on said platform for rotation relative to said platform about said axis, and wherein said movement of said platform accelerates said spin drive, said target object and said actuator assembly while said actuator assembly vibrates said target object and said spin drive spins said target object and said actuator assembly about said axis.

3. The apparatus of claim 2, wherein said platform is a centrifuge arm supported for rotation about a centrifuge axis.

4. The apparatus of claim 1, wherein said actuator assembly includes first and second mounting structures, and wherein said PE actuator is connected between said first and second mounting structures.

5. The apparatus of claim 1, wherein said actuator assembly includes a plurality of said PE actuators, and wherein said PE materials of said PE actuators are connected in parallel to said drive control input.

6. The apparatus of claim 5, including said target object, wherein said actuator assembly is connected to said target object, and including a drive controller coupled to said drive control input for providing said drive control signal, and a sensor for producing a sensor signal indicative of a vibration condition associated with said target object, said sensor coupled to said drive controller, and said drive controller configured to adjust said drive control signal based on said sensor signal.

7. The apparatus of claim 1, wherein said actuator assembly includes a plurality of said PE actuators, and including a plurality of said drive control inputs for receiving respective ones of a plurality of said drive control signals, said drive control inputs respectively connected to said PE materials of said PE actuators.

8. The apparatus of claim 7, including said target object, wherein said actuator assembly is connected to said target object, and including a drive controller coupled to said drive control inputs for providing said drive control signals, and a plurality of sensors for producing respective sensor signals indicative of respective vibration conditions associated with said target object, said sensors coupled to said drive controller, and said drive controller configured to adjust said drive control signals based on said sensor signals.

9. The apparatus of claim 1, wherein said actuator assembly includes a mounting structure connected to the target object, said mounting structure having a plurality of connection sites configured to permit connection of said PE actuator to said mounting structure, and wherein said PE actuator is connected to a selected one of said connection sites.

10. The apparatus of claim 1, wherein said actuator assembly includes a plurality of said PE actuators having said PE materials thereof coupled to said drive control input, said PE actuators arranged such that the respectively corresponding displacements occur along respectively corresponding displacement axes to produce simultaneous vibrations along said displacement axes.

11. An apparatus for subjecting a target object to vibration and acceleration, comprising:
a target object;
an actuator connected to said target object to impart vibration to said target object;
a centrifuge arm assembly including a centrifuge arm supported for rotation about a centrifuge axis, said target object mounted on said centrifuge arm, said rotation of said centrifuge arm accelerating said target object and said actuator while said actuator vibrates said target object; and
a counterweight connected to said target object for reducing a centrifugal load of said target object on said actuator during said rotation of said centrifuge arm.

12. The apparatus of claim 11, wherein said counterweight is adapted to eliminate said centrifugal load.

13. The apparatus of claim 11, including a strap having a first end portion connected to said target object and a second end portion connected to said counterweight, wherein a further portion of said strap between said first and second end portions thereof engages said centrifuge arm assembly.

14. The apparatus of claim 13, wherein said centrifuge arm assembly includes a sheave carried on said centrifuge arm between said target object and said centrifuge axis, and wherein said further portion of said strap engages said sheave.

15. The apparatus of claim 13, wherein said strap includes a load sensor located between said first and second end portions for monitoring a load condition associated with said strap.

16. An apparatus for subjecting a target object to acceleration and spin, comprising:
a platform supported for movement;
a spin drive carried on said platform;
a drive shaft rotationally coupled to said spin drive; and
a target object assembly supported entirely by said drive shaft and rotationally coupled to said drive shaft to permit spinning said target object assembly relative to said platform while said movement of said platform accelerates said target object assembly, said spin drive and said drive shaft.

17. The apparatus of claim 16, wherein said platform is a centrifuge arm supported for rotation about a centrifuge axis.

18. The apparatus of claim 16, wherein said target object assembly is fixedly mounted on said drive shaft.

19. The apparatus of claim 18, wherein said drive shaft has a weight that is about ten times a weight of a target object carried by said target object assembly.

20. The apparatus of claim 18, wherein said drive shaft has an end opposite said spin drive, and wherein said target object assembly is mounted on said end of said drive shaft.

21. An apparatus for subjecting a target object to vibration and spin, comprising:
a target object supported for rotation about a central rotational axis thereof;
an actuator connected to said target object for rotation therewith about said axis and adapted to impart vibration to said target object; and
a spin drive rotationally coupled to said target object for spinning said target object and said actuator about said axis while said actuator vibrates said target object.

22. The apparatus of claim 21, including a platform supported for movement, wherein said spin drive is carried on said platform, wherein said target object is supported on said platform for rotation relative to said platform about said axis, and wherein said movement of said platform accelerates said spin drive, said target object and said actuator while said actuator is vibrating said target object and said spin drive is spinning said target object and said actuator relative to said platform about said axis.

23. The apparatus of claim 22, wherein said platform is a centrifuge arm supported for rotation about a centrifuge axis.

* * * * *